United States Patent
Matsunaga et al.

(10) Patent No.: US 8,747,682 B2
(45) Date of Patent: Jun. 10, 2014

(54) PATTERN FORMATION METHOD AND METHOD FOR MANUFACTURING SEMICONDUCTOR DEVICE

(75) Inventors: Kentaro Matsunaga, Tokyo (JP); Tomoya Oori, Mie-ken (JP); Eishi Shiobara, Mie-ken (JP); Yukiko Sato, Kanagawa-ken (JP); Yoshihisa Kawamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 12/849,599

(22) Filed: Aug. 3, 2010

(65) Prior Publication Data

US 2011/0034029 A1 Feb. 10, 2011

(30) Foreign Application Priority Data

Aug. 4, 2009 (JP) ................................. 2009-181332

(51) Int. Cl.
| | |
|---|---|
| C03C 15/00 | (2006.01) |
| C03C 25/68 | (2006.01) |
| C23F 1/00 | (2006.01) |
| H01B 13/00 | (2006.01) |
| B44C 1/22 | (2006.01) |

(52) U.S. Cl.
USPC .................. 216/49; 216/13; 216/17; 216/41; 216/69; 438/694; 438/710

(58) Field of Classification Search
USPC ............ 216/13–21, 41, 49, 67; 438/694, 710
See application file for complete search history.

(56) References Cited

U.S. PATENT DOCUMENTS

| | | | | |
|---|---|---|---|---|
| 2002/0076703 | A1* | 6/2002 | Saraf et al. | 435/6 |
| 2002/0136927 | A1* | 9/2002 | Hieda et al. | 428/694 T |
| 2003/0222048 | A1* | 12/2003 | Asakawa et al. | 216/2 |
| 2006/0261379 | A1* | 11/2006 | Tsukamoto et al. | 257/246 |

(Continued)

FOREIGN PATENT DOCUMENTS

| | | |
|---|---|---|
| JP | 2000-194142 | 7/2000 |
| JP | 2005-41931 | 2/2005 |

(Continued)

OTHER PUBLICATIONS

Notification of Reason(s) for Refusal issued by the Japanese Patent Office on Oct. 29, 2012, for Japanese Patent Application No. 2009-181332, and English-language translation thereof.
Notification of Reason(s) for Refusal issued by the Japanese Patent Office on Jun. 5, 2013, for Japanese Patent Application No. 2009-181332, and English-language translation thereof.

*Primary Examiner* — Allan Olsen
*Assistant Examiner* — Margaret D Klunk
(74) *Attorney, Agent, or Firm* — Finnegan, Henderson, Farabow, Garrett & Dunner, L.L.P.

(57) ABSTRACT

According to one embodiment, a pattern formation method is disclosed. The method includes forming a plurality of regions on a foundation and the plurality of the regions correspond to different pattern sizes. The method includes separating each of a plurality of block copolymers from another one of the plurality of the block copolymers and segregating the each of the plurality of the block copolymers into a corresponding one of the regions. The method includes performing a phase separation of the each of the block copolymers of each of the regions. The method includes selectively removing a designated phase of each of the phase-separated block copolymers to form a pattern of the each of the block copolymers and the pattern has a different pattern size for the each of the regions.

10 Claims, 4 Drawing Sheets

(56) References Cited

U.S. PATENT DOCUMENTS

| | | | |
|---|---|---|---|
| 2007/0175859 A1* | 8/2007 | Black et al. | 216/41 |
| 2007/0224823 A1* | 9/2007 | Sandhu | 438/694 |
| 2007/0289943 A1* | 12/2007 | Lu et al. | 216/41 |
| 2008/0041818 A1 | 2/2008 | Kihara et al. | |
| 2008/0193658 A1* | 8/2008 | Millward | 427/401 |
| 2008/0311347 A1* | 12/2008 | Millward et al. | 428/144 |
| 2010/0108993 A1* | 5/2010 | Moriwaki et al. | 257/40 |
| 2012/0214094 A1* | 8/2012 | Mikoshiba et al. | 430/14 |

FOREIGN PATENT DOCUMENTS

| | | |
|---|---|---|
| JP | 2007-125699 | 5/2007 |
| JP | 2008-43873 | 2/2008 |
| JP | 2010-284921 | 12/2010 |

* cited by examiner

PATTERN FORMATION METHOD AND METHOD FOR MANUFACTURING SEMICONDUCTOR DEVICE

CROSS-REFERENCE TO RELATED APPLICATION

This application is based upon and claims the benefit of priority from the prior Japanese Patent Application No. 2009-181332, filed on Aug. 4, 2009; the entire contents of which are incorporated herein by reference.

FIELD

Embodiments described herein relate generally to a pattern formation method and a method for manufacturing a semiconductor device.

BACKGROUND

Methods that utilize the phenomenon of a material forming a designated regular arrangement pattern by a self-organizing phase separation are drawing attention as formation methods of ultra-fine patterns. In known art, for example, a self-organizing material is formed by dissolving a block copolymer in a solvent and coating the solution thereof onto a substrate surface by spin coating, dip coating, and the like. In such a case, only one certain type of block copolymer film is formed on the substrate. Accordingly, only one type of pattern size is obtained by the phase separation of the block copolymer. However, when forming circuit patterns of semiconductor devices, monotonous patterns in which only one type of circuit width is formed on the substrate are rare; and it is desirable to form patterns having multiple line widths simultaneously on the same substrate.

DETAILED DESCRIPTION

According to one embodiment, a pattern formation method is disclosed. The method includes forming a plurality of regions on a foundation and the plurality of the regions correspond to different pattern sizes. The method includes separating each of a plurality of block copolymers from another one of the plurality of the block copolymers and segregating the each of the plurality of the block copolymers into a corresponding one of the regions. The method includes performing a phase separation of the each of the block copolymers of each of the regions. The method includes selectively removing a designated phase of each of the phase-separated block copolymers to form a pattern of the each of the block copolymers and the pattern has a different pattern size for the each of the regions.

Figures 1A, 1B:
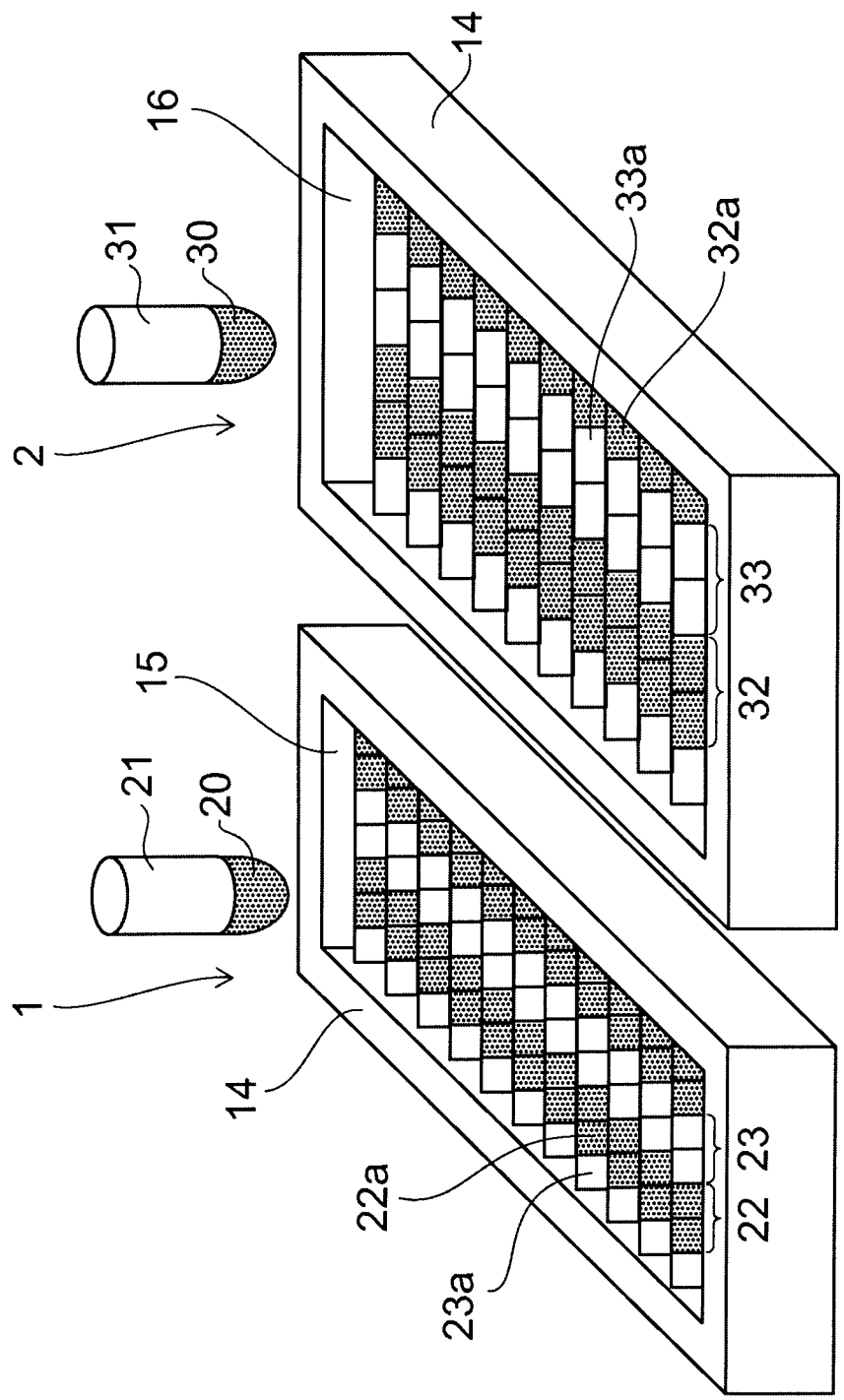
FIGS. 1A and 1B are schematic views illustrating the concept of a pattern formation method according to an embodiment.

FIG. 1A illustrates a first region 1. FIG. 1B illustrates a second region 2. A foundation film 14 is formed in the first region 1 and the second region 2; a recess 15 is made in the foundation film 14 of the first region 1; and a recess 16 is made in the foundation film 14 of the second region 2.

A first solution 20, which includes a first block copolymer of a molecular weight (a number average molecular weight) X dissolved in the desired solvent, is supplied to the recess 15 from a nozzle 21. A second solution 30, which includes a second block copolymer having a molecular weight (a number average molecular weight) Y dissolved in the desired solvent, is supplied to the recess 16 from a nozzle 31. The molecular weight Y is different from the molecular weight X.

The block copolymer has a structure in which multiple types of polymer chains are linked. Each of the polymer chains has a chain structure of one type of monomer. By dissolving the block copolymer in an appropriate solvent with an appropriate concentration, polymer chains of the same type coalesce with each other to form a block (a phase) made of the same type of polymer chain. At this time, a phase-separated structure is expressed in which the different types of phases are periodically and alternately repeated sufficiently without the different types of phases mixing with each other.

In the first region 1 illustrated in FIG. 1A, a phase-separated structure is obtained in which an A polymer chain 22a coalesces in an A phase 22 and a B polymer chain 23a coalesces in a B phase 23. In the second region 2 illustrated in FIG. 1B, a phase-separated structure is obtained in which an A polymer chain 32a coalesces in an A phase 32 and a B polymer chain 33a coalesces in a B phase 33.

The structure of the block copolymer is not limited to two types of linked polymer chains. The structure may include three or more types of linked polymer chains.

A method for manufacturing a semiconductor device utilizing the pattern formation method according to this embodiment will now be described with reference to FIGS. 2A to 3D.

Figure 2A:
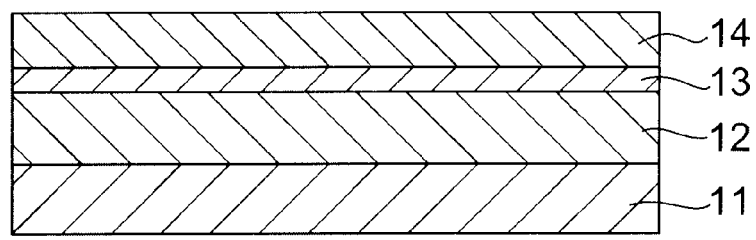
FIG. 2A to FIG. 3D are schematic views illustrating a method for manufacturing a semiconductor device according to the embodiment.

FIG. 2A illustrates the configuration of the foundation. The object of the pattern formation is a semiconductor wafer 11. An amorphous carbon film 12 is formed on the semiconductor wafer 11; a SiON film 13 is formed on the amorphous carbon film 12; and a foundation film 14 is formed on the SiON film 13.

The semiconductor wafer 11 has a structure in which a semiconductor layer, an insulating layer, a conductive layer, etc., are formed on, for example, a silicon substrate. For example, the film thickness of the amorphous carbon film 12 is 200 nm; the film thickness of the SiON film 13 is 30 nm; and the film thickness of the foundation film 14 is 50 nm.

Figure 2B:
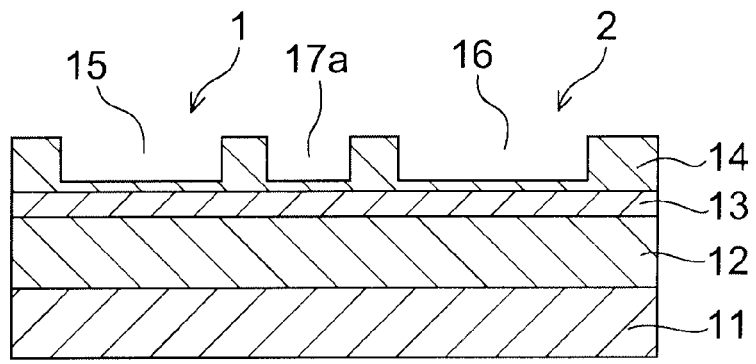

The foundation film 14 is, for example, a thermosetting resin imprint material or a photocurable resin imprint material. As illustrated in FIG. 2B, recesses and protrusions are formed in the foundation film 14 by imprinting using a template. The recess 15 is made in the first region 1; and the recess 16 is made in the second region 2. A trench 17a is made between the recess 15 and the recess 16.

Figure 2C:
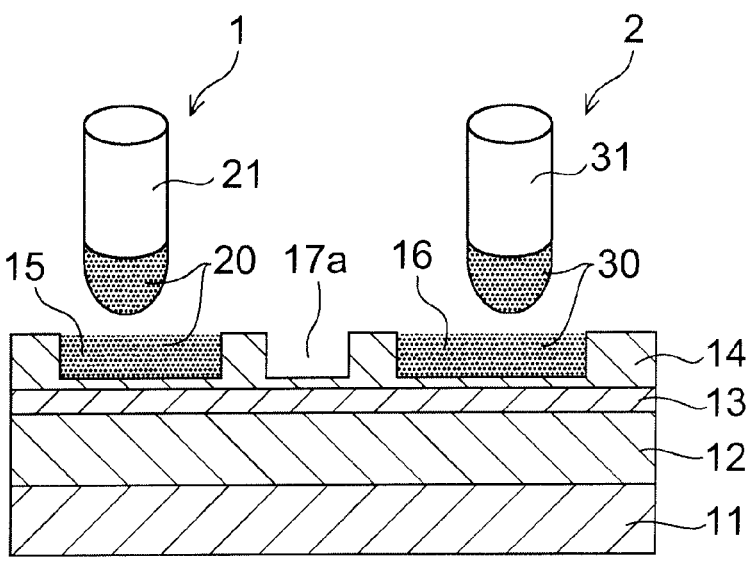

Then, block copolymers are supplied to the recesses 15 and 16, respectively, by, for example, an inkjet method. As illustrated in FIG. 2C, the first solution 20, in which the first block copolymer is dissolved in the desired solvent, is supplied to the recess 15 from the nozzle 21. The second solution 30, in which the second block copolymer is dissolved in the desired solvent, is supplied to the recess 16 from the nozzle 31.

After supplying the solutions 20 and 30 to the recesses 15 and 16, respectively, a first block copolymer film is formed in the recess 15 and a second block copolymer film is formed in the recess 16 by volatilizing the solvents. The film thicknesses of these films are substantially the same as the film thickness of the foundation film 14 or the depths of the recesses 15 and 16.

The first block copolymer includes, for example, polystyrene and polymethylmethacrylate as polymer chains. In the first block copolymer, for example, the number average molecular weight of polystyrene is 10,000; and the number average molecular weight of polymethylmethacrylate is 33,000.

The second block copolymer includes, for example, polystyrene and polymethylmethacrylate as polymer chains. In the second block copolymer, for example, the number average molecular weight of polystyrene is 170,000; and the number average molecular weight of polymethylmethacrylate is 40,000.

In other words, although the polymer chains of the first block copolymer and the second block copolymer are the same, the molecular weights thereof are different. Accordingly, the first block copolymer and the second block copolymer having different molecular weights are segregated into the regions 1 and 2, respectively, on the same foundation.

The polymer chains of the each of the block copolymers are not limited to combinations of polystyrene and polymethylmethacrylate. It is sufficient to be able to form different phases into a regular arrangement structure by a self-organizing phase separation. For example, combinations of polystyrene and polybutadiene, combinations of polystyrene and polyisoprene, etc., may be used. Each of the block copolymers may include three or more types of polymer chains.

Normally, the phase separation does not progress sufficiently for the block copolymer as-is; and in many cases, the phase-separated structure has a low regularity. Therefore, for the phase separation to progress sufficiently and to obtain a structure having a higher regularity, in this embodiment, heat treatment, for example, is performed.

Figure 2D:
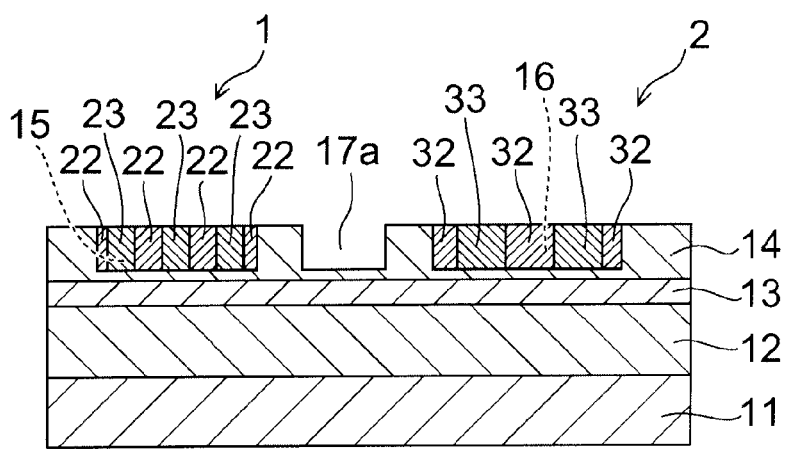

For example, heat treatment is performed for 30 hours at 210° C., that is, not less than the glass transition temperatures of the polymer chains, in a hydrogen reducing atmosphere to prevent oxidation. Thereby, as illustrated in FIG. 2D, the block copolymers of the regions 1 and 2 undergo phase separation into blocks having sizes corresponding to the molecular weights of the polymer chains thereof.

In the recess 15, the first block copolymer is phase-separated into the A phase 22 made of blocks of the A polymer chain and the B phase 23 made of blocks of the B polymer chain. In the recess 16, the second block copolymer is phase-separated into the A phase 32 made of blocks of the A polymer chain and the B phase 33 made of blocks of the B polymer chain. In the example described above, one selected from polystyrene and polymethylmethacrylate is the A polymer chain and the other is the B polymer chain.

The molecular weight of the A polymer chain of the first block copolymer differs from the molecular weight of the A polymer chain of the second block copolymer. For example, the molecular weight of the A polymer chain of the second block copolymer is greater than that of the A polymer chain of the first block copolymer. Therefore, when the phase separation is performed, the width (the width in the periodic arrangement direction) of the A phase 32 of the second block copolymer is greater than that of the A phase 22 of the first block copolymer.

Also, the molecular weight of the B polymer chain of the first block copolymer differs from the molecular weight of the B polymer chain of the second block copolymer. For example, the molecular weight of the B polymer chain of the second block copolymer is greater than that of the B polymer chain of the first block copolymer. Therefore, when the phase separation is performed, the width (the width in the periodic arrangement direction) of the B phase 33 of the second block copolymer is greater than that of the B phase 23 of the first block copolymer.

Then, a designated phase of each of the phase-separated block copolymers is selectively removed. For example, in the case where the A phases 22 and 32 are polystyrene and the B phases 23 and 33 are polymethylmethacrylate, the difference of the etching rates between the two phases can be utilized because the etching resistance of polystyrene with respect to Reactive Ion Etching (RIE) using oxygen or $CF_4$ gas as the etchant is higher than that of polymethylmethacrylate.

For example, the B phases 23 and 33, i.e., the polymethylmethacrylate, can be selectively removed by performing RIE for 20 seconds by introducing oxygen to the processing chamber with a flow rate of 300 SCCM, maintaining the total pressure in the processing chamber at 200 millitorrs, and providing a high frequency power of 300 W.

The selective removing of the designated phase of the phase-separated structure is not limited to RIE. The difference of solubility between the two phases with respect to an etchant, the difference of decomposability with respect to an energy beam, the difference of thermal decomposability, etc., may be utilized.

For example, in the case where the block copolymers include polystyrene and polybutadiene, it is possible to selectively remove the polybutadiene phase by ozone processing to leave only the polystyrene phase.

In the case where an electron beam is irradiated onto a block copolymer including polystyrene and polymethylmethacrylate, the main chain of the polymethylmethacrylate is cut and only the phase of the polymethylmethacrylate can be dissolved by an etchant such as methyl isobutyl ketone, ethyl lactate, acetone, etc.

It is possible to use a block copolymer including a thermally decomposable polymer chain in which the main chain is cut by heating, or a heat-resistant polymer chain having a glass transition temperature not less than the thermal decomposition temperature of the thermally decomposable polymer chain; and only the thermally decomposable polymer chain may be removed selectively.

Figure 3A:
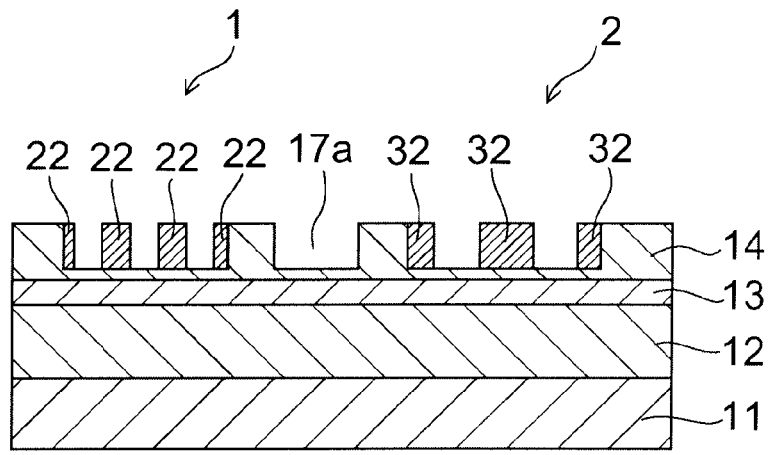

By selectively removing the designated phases of the phase-separated structures, a pattern of the block copolymer having a different pattern size for each of the regions 1 and 2 is formed as illustrated in FIG. 3A. In the first region 1, the A phase 22 is left, for example, in a line configuration; the B phase 23 is removed; and trenches (recesses) are thereby made between adjacent A phases 22. In other words, the first block copolymer forms a line-and-space pattern in the first region 1

In the second region 2, the A phase 32 is left, for example, in a line configuration; the B phase 33 is removed; and trenches (recesses) are thereby made between adjacent A phases 32. In other words, the second block copolymer forms a line-and-space pattern in the second region 2.

Here, the molecular weight of the A polymer chain of the first block copolymer is different from that of the second block copolymer; and the molecular weight of the B polymer chain of the first block copolymer is different from that of the second block copolymer. Also, the molecular weight of the entire first block copolymer (the sum of the molecular weight of the A polymer chain and the molecular weight of the B polymer chain) is different from the molecular weight of the entire second block copolymer (the sum of the molecular weight of the A polymer chain and the molecular weight of the B polymer chain).

Accordingly, the line width of the first block copolymer pattern formed in the first region 1 is different from the line width of the second block copolymer pattern formed in the second region 2. Also, the trench width of the first block copolymer pattern is different from the trench width of the second block copolymer pattern. The period of the first block copolymer pattern is different from the period of the second block copolymer pattern. In the example illustrated in FIG. 3A, the pattern formed in the first region 1 has a finer line width, trench width, and period than those of the pattern formed in the second region 2.

By observing the surface of the structure obtained by the processes up to that illustrated in FIG. 3A by an atomic force microscope, the inventors confirmed that trenches (recesses) having a width of 20 nm, a depth of 50 nm, and a period of 40 nm were arranged at uniform spacing in the first region 1, and trenches (recesses) having a width of 30 nm, a depth of 50 nm, and a period of 60 nm were arranged at uniform spacing in the second region 2.

Then, the foundation is patterned using the pattern of the block copolymer as a mask. Here, the object to be patterned is the semiconductor wafer 11. However, in this embodiment, the amorphous carbon film 12 and the SiON film 13 are interposed between the semiconductor wafer 11 and the block copolymer film. The amorphous carbon film 12 formed on the semiconductor wafer 11 has a high etching selectivity with respect to, for example, silicon, silicon oxide films, and silicon nitride films. The SiON film 13 formed on the amorphous carbon film 12 has a high etching selectivity with respect to the amorphous carbon film 12. The SiON film 13 has a high etching selectivity with respect to the foundation film 14 and the A phases 22 and 32 of the block copolymers remaining in the recesses thereof.

Generally, the size of the phase-separated structure of the block copolymer in the film thickness direction is substantially the same or less than the period of the phase-separated structure formed in the two dimensional direction. Therefore, it is difficult to sufficiently ensure the etching resistance of the portions remaining as the mask. Accordingly, it is difficult to obtain a recess having a high aspect ratio in the case where the object to be patterned is etched utilizing the phase-separated structure of such a block copolymer as-is as the etching mask.

Therefore, in this embodiment, the pattern of the block copolymer is transferred onto the pattern transfer films of the SiON film 13, the amorphous carbon film 12, etc., provided between the block copolymer film and the object to be patterned; and then, the patterned pattern transfer films are used as masks to etch the relatively thick structural body therebelow. Thereby, it is possible to form a pattern of the object to be patterned having a high aspect ratio.

Figure 3B:
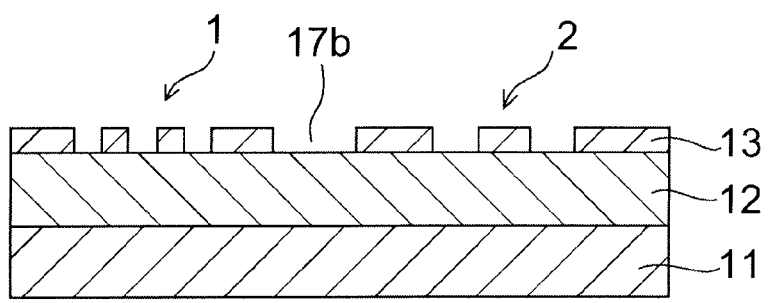

First, RIE is performed using the A phases 22 and 32 of the block copolymers remaining on the foundation and the foundation film 14 as a mask. Thereby, the SiON film 13 is patterned as illustrated in FIG. 3B. A trench 17b is made at a portion corresponding to the trench 17a of the foundation film 14 made between the first region 1 and the second region 2.

Figure 3C:
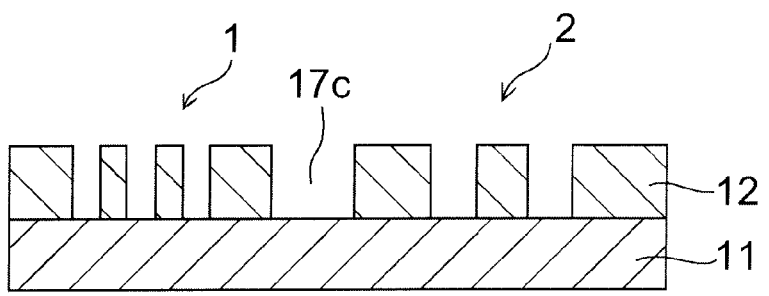

Then, RIE is performed using the patterned SiON film 13 as a mask. Thereby, the amorphous carbon film 12 is patterned as illustrated in FIG. 3C. A trench 17c is made at a portion corresponding to the trench 17b made in the SiON film 13.

Figure 3D:
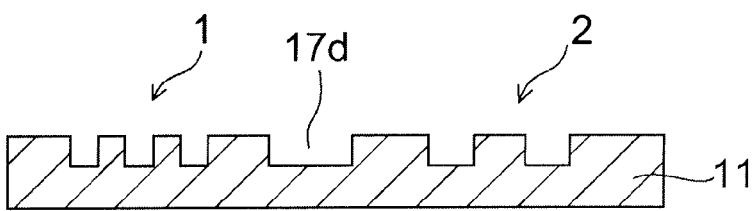

Continuing, RIE is performed using the patterned amorphous carbon film 12 as a mask. Thereby, the surface layer portion of the semiconductor wafer 11 is patterned as illustrated in FIG. 3D. In other words, a line-and-space pattern is formed in the semiconductor wafer 11 in each of the first region 1 and the second region 2. Also, a trench 17d is made at a portion corresponding to the trench 17c made in the amorphous carbon film 12. An insulator is filled into the trench 17d; and the trench 17d insulatively separates the first region 1 and the second region 2.

The pattern size (the line width, the trench width, and the pitch) of the line-and-space pattern formed in the first region 1 is different from that of the line-and-space pattern formed in the second region 2 due to the difference of the molecular weights of the block copolymers supplied to the regions 1 and 2 and the difference of the molecular weights of the polymer chains of the same type of the block copolymers supplied to the regions 1 and 2.

In other words, in this embodiment, multiple ultra-fine patterns having different pattern sizes are formed simultaneously in the same semiconductor wafer 11 utilizing the phase separations of the block copolymers. By utilizing the phase separations of the block copolymers, an ultra-fine pattern equal to or less than the resolution limit of the lithography can be realized with low costs and high throughput.

In the case where the molecular weight of the A polymer chain of the first block copolymer is different from that of the second block copolymer, the width of the A phase formed in the first region 1 is different from the width of the A phase formed in the second region 2. In the case where the molecular weight of the B polymer chain of the first block copolymer is different from that of the second block copolymer, the width of the B phase formed in the first region 1 is different from the width of the B phase formed in the second region 2. Accordingly, in the case of different molecular weights of the same polymer chain of the first block copolymer and the second block copolymer, patterns having different pattern sizes can be formed on the semiconductor wafer 11.

The pattern type is not limited to a line-and-space pattern and may be a hole pattern or an island pattern. In the case of a hole pattern, multiple block copolymers having different molecular weights are prepared according to the hole diameter and the hole spacing; each of the block copolymers is supplied to a corresponding region on the semiconductor wafer; and phase separation is performed. Thereby, multiple hole patterns having different sizes can be formed simultaneously in the same semiconductor wafer. Similarly, in the case of an island pattern as well, multiple block copolymers having different molecular weights are prepared according to the size and spacing of the islands; each of the block copolymers is supplied to a corresponding region on the semiconductor wafer; and a phase separation is performed. Thereby, multiple island patterns having different sizes can be formed simultaneously in the same semiconductor wafer.

Even in the case where a line-and-space pattern, a hole pattern, and an island pattern are mixed in the same semiconductor wafer, multiple block copolymers having different molecular weights corresponding to the size of the patterns are prepared; each of the block copolymers is supplied to a corresponding region on the semiconductor wafer; and phase separation is performed. Thereby, multiple patterns of different types can be formed simultaneously in the same semiconductor wafer.

By providing the block copolymer with fluidic properties by heat or a solvent vapor, a self-organizing microscopic phase separation occurs due to the repulsive interactions between the A polymer chain and the B polymer chain; and a phase-separated structure having a period of a single nanometer to several tens of nanometers is formed as a thermodynamically stable phase. The configuration thereof changes among a spherical, cylindrical, and lamella configuration by the volume fractions of the A polymer chain and the B polymer chain. As the volume fractions of the A polymer chain and the B polymer chain approach each other, a lamella phase-separated structure can be formed. In such a case, it is possible to form a line-and-space pattern. In the case where the volume fractions of the A polymer chain and the B polymer chain are greatly different, a spherical or cylindrical phase-separated structure can be formed. In such a case, it is possible to form a hole pattern or an island pattern.

Although recesses and protrusions including the recesses 15 and 16, i.e., the supplying portions of the block copolymers, are made in an imprint material by imprinting in the embodiments described above, the recesses 15 and 16 can be made by transferring a latent pattern image onto a resist by photolithography, direct drawing with an electron beam, etc., and subsequently performing selective etching of the resist.

It is desirable for the method of supplying the block copolymers to the regions 1 and 2 to be able to locally supply to the desired position with good positional precision and to have excellent controllability of the supply amount. Such methods include an inkjet method that drops the block copolymer solution using the nozzle described above, a method of dropping the block copolymer solution through a microtube, a method of dropping a liquid droplet attached to the tip of a microneedle, etc.

Figure 4:
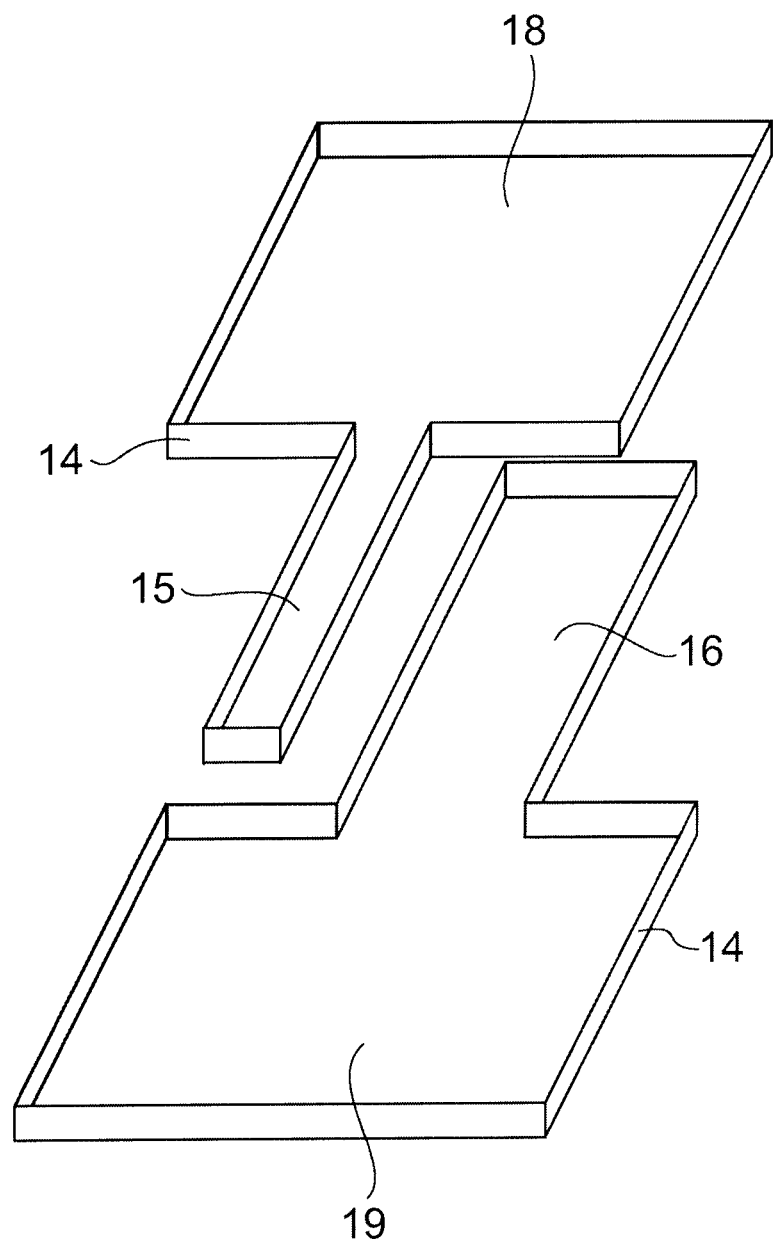
FIG. 4 is a schematic view of a supply portion of block copolymer solution.

In the case where the recesses 15 and 16 are extremely fine regions and it is difficult to locally supply the solution to only the recesses 15 and 16, it is effective to provide solution supply regions 18 and 19 which are larger than the recesses 15 and 16 as illustrated in FIG. 4. The solution supply region 18 communicates with the recess 15; and the solution supply region 19 communicates with the recess 16. The solution dropped into the solution supply region 18 flows into the recess 15 and is filled into the recess 15; and the solution dropped into the solution supply region 19 flows into the recess 16 and is filled into the recess 16.

Similarly to the recesses 15 and 16, the solution supply regions 18 and 19 are made in recessed configurations enclosed with the side walls of the foundation film 14. Therefore, each of the block copolymers, in which the polymer chains are adjusted to the desired molecular weights, can be supplied to only the desired region without the block copolymers mixing with each other. By subsequently removing the solution supply regions 18 and 19, other patterns can be formed in the region of the solution supply regions 18 and 19. Or, an insulator may be filled into the solution supply regions 18 and 19; and other patterns may be formed on the insulator.

In the embodiments described above, the recesses 15 and 16 are made in the regions 1 and 2; and the block copolymers are supplied to the recesses 15 and 16. Therefore, the block copolymers are constrained to the recesses 15 and 16 by the side walls of the recesses 15 and 16. Therefore, the desired block copolymer can be reliably separated and segregated from the other block copolymer in the desired circuit formation region. Accordingly, only the pattern of the target size can be formed in each of the regions.

In each of the regions, it is possible to segregate the desired block copolymer in a state of being separated from the other block copolymer by not only making recesses but also, for example, causing only designated molecules to coalesce easily by selectively irradiating an energy beam onto the portions where the phase-separated structure of the block copolymer is to be formed, providing a difference of the irradiation amounts of the energy beam irradiated onto each of the regions, or selectively performing a surface processing such as the vapor deposition of a substance.

The promoting of the phase separation of the block copolymer is not limited to heat treatment. Energy beam irradiation also may be used. Or, chemicals may be added. The materials of the first block copolymer supplied to the first region 1 are not limited to the materials of the second block copolymer supplied to the second region 2. Different materials may be used. It is important that the molecular weights of the polymer chains of the block copolymers are adjusted to obtain a phase-separated structure having a period corresponding to the pattern size to be formed in each of the regions.

The pattern formation method of the invention is not limited to the pattern formation of a semiconductor device. Applications are possible also when forming ultra-fine recess/protrusion patterns of magnetic recording mediums, optical recording mediums, etc.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the invention.

The invention claimed is:

1. A pattern formation method, comprising:
   forming a plurality of regions on a foundation, the plurality of the regions corresponding to different pattern sizes, each of the regions having a recess;
   forming a solution supply region on the foundation to communicate with the recess, the solution supply region having a recessed configuration larger than the recess;
   dropping a solution including each of a plurality of block copolymers dissolved in a solvent into the solution supply region from a nozzle by an inkjet method and flowing the solution into the recess;
   performing a phase separation of the each of the block copolymers of each of the regions; and
   selectively removing a designated phase of each of the phase-separated block copolymers to form a pattern of the each of the block copolymers, the pattern having a different pattern size for the each of the regions, wherein
   the recesses are arranged in a first direction,
   each one of the recesses is connected with only one solution supply region,
   a first one of the solution supply regions is connected with a first end of a first one of the recesses, and
   a second one of the solution supply regions is connected with a second end of a second one of the recesses neighboring the first recess in the first direction, the second end opposite to the first end in a second direction perpendicular to the first direction.

2. The method according to claim 1, wherein the each of the block copolymers includes a polymer chain having a different molecular weight for the each of the plurality of the block copolymers.

3. The method according to claim 1, wherein the recess is made by imprinting using a template.

4. The method according to claim 1, wherein the phase separation of the each of the block copolymers is performed by heat treatment.

5. The method according to claim 4, wherein the heat treatment is performed in a hydrogen reducing atmosphere.

6. The method according to claim 4, wherein a temperature of the heat treatment is not less than a glass transition temperature of a polymer chain of the each of the block copolymers.

7. The method according to claim 1, wherein the selective removing of the designated phase is performed by Reactive Ion Etching (RIE) utilizing a difference of etching resistances with respect to the RIE between different phases of the each of the phase-separated block copolymers.

8. The method according to claim 1, wherein the selective removing of the designated phase is performed with an etchant by utilizing a difference of solubility with respect to the etchant between different phases of the each of the phase-separated block copolymers.

9. The method according to claim 1, wherein the pattern of the each of the block copolymers is a line-and-space pattern.

10. A method for manufacturing a semiconductor device, comprising:

forming a plurality of regions on a foundation, the plurality of the regions corresponding to different pattern sizes, each of the regions having a recess;

forming a solution supply region on the foundation to communicate with the recess, the solution supply region having a recessed configuration larger than the recess;

dropping a solution including each of a plurality of block copolymers dissolved in a solvent into the solution supply region from a nozzle by an inkjet method and flowing the solution into the recess;

performing a phase separation of the each of the block copolymers of each of the regions;

selectively removing a designated phase of each of the phase-separated block copolymers to form a pattern of the each of the block copolymers, the pattern having a different pattern size for the each of the regions; and patterning the foundation using a phase of the each of the block copolymers remaining on the foundation as a mask, wherein the recesses are arranged in a first direction, each one of the recesses is connected with only one solution supply region, a first one of the solution supply regions is connected with a first end of a first one of the recesses, and a second one of the solution supply regions is connected with a second end of a second one of the recesses neighboring the first recess in the first direction, the second end opposite to the first end in a second direction perpendicular to the first direction.

\* \* \* \* \*